US008681493B2

(12) United States Patent
Vishal et al.

(10) Patent No.: US 8,681,493 B2
(45) Date of Patent: Mar. 25, 2014

(54) HEAT SHIELD MODULE FOR SUBSTRATE-LIKE METROLOGY DEVICE

(75) Inventors: Vaibhaw Vishal, Fremont, CA (US); Mei Sun, Los Altos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 171 days.

(21) Appl. No.: 13/104,874

(22) Filed: May 10, 2011

(65) Prior Publication Data

US 2012/0287574 A1 Nov. 15, 2012

(51) Int. Cl.
*H05K 7/20* (2006.01)

(52) U.S. Cl.
USPC ........... 361/688; 257/712; 257/717; 174/520; 174/547

(58) Field of Classification Search
USPC ............... 361/688, 679.46, 679.47, 719, 704, 361/717; 257/712, 717, 720; 428/223; 174/520, 50, 547, 548
See application file for complete search history.

(56) References Cited

U.S. PATENT DOCUMENTS

| | | | |
|---|---|---|---|
| 3,589,979 A | 6/1971 | Finch | |
| 4,410,874 A * | 10/1983 | Scapple et al. | 338/307 |
| RE32,369 E | 3/1987 | Stockton | |
| 4,656,454 A | 4/1987 | Rosenberger | |
| 4,680,569 A | 7/1987 | Yamaki | |
| 5,001,934 A | 3/1991 | Tuckey | |
| 5,184,107 A | 2/1993 | Maurer | |
| 5,262,944 A | 11/1993 | Weisner | |
| 5,285,559 A * | 2/1994 | Thompson et al. | 29/841 |
| 5,341,684 A | 8/1994 | Adams | |
| 5,435,646 A | 7/1995 | McArthur | |
| 5,444,637 A | 8/1995 | Smesny | |
| 5,479,197 A | 12/1995 | Fujikawa | |
| 5,518,593 A | 5/1996 | Hosokawa et al. | |
| 5,564,889 A | 10/1996 | Araki | |
| 5,629,538 A | 5/1997 | Lipphardt | |
| 5,669,713 A | 9/1997 | Schwartz | |
| 5,790,151 A | 8/1998 | Mills | |

(Continued)

FOREIGN PATENT DOCUMENTS

| | | |
|---|---|---|
| EP | 0539804 | 5/1993 |
| EP | 0563713 | 10/1993 |

(Continued)

OTHER PUBLICATIONS

International Search Report mailed date Oct. 18, 2012 issued for PCT International Application No. PCT/US2012/032761.

(Continued)

*Primary Examiner* — Jenny L Wagner
*Assistant Examiner* — Dimary Lopez
(74) *Attorney, Agent, or Firm* — Joshua D. Isenberg; JDI Patent

(57) ABSTRACT

A heat shield module includes top and bottom portions made of a high heat material. The top and bottom portions attached to each other and form an enclosure with an opening sized to receive an electronic component package with no intervening insulating material between a component and the top and bottom portions. One or more legs are mounted to either the top portion or the bottom portion. The legs are configured to attach the enclosure to a substrate and to form a gap between the bottom surface of the bottom portion and a top surface of the substrate.

32 Claims, 6 Drawing Sheets

(56) References Cited

U.S. PATENT DOCUMENTS

| | | | |
|---|---|---|---|
| 5,895,859 A | 4/1999 | Sawada | |
| 5,969,639 A | 10/1999 | Lauf | |
| 5,970,313 A | 10/1999 | Rowland | |
| 6,010,538 A | 1/2000 | Sun | |
| 6,033,922 A | 3/2000 | Rowland | |
| 6,075,909 A | 6/2000 | Ressl | |
| 6,100,506 A | 8/2000 | Colelli, Jr. | |
| 6,164,132 A | 12/2000 | Matulek | |
| 6,190,040 B1 | 2/2001 | Renken | |
| 6,201,467 B1 | 3/2001 | Winterer | |
| 6,273,544 B1 | 8/2001 | Silverbrook | |
| 6,313,903 B1 | 11/2001 | Ogata | |
| 6,325,536 B1 | 12/2001 | Renken | |
| 6,378,378 B1 | 4/2002 | Fisher | |
| 6,472,240 B2 | 10/2002 | Akram | |
| 6,477,447 B1 | 11/2002 | Lin | |
| 6,487,073 B2 * | 11/2002 | McCullough et al. | 361/679.54 |
| 6,542,835 B2 | 4/2003 | Mundt | |
| 6,553,277 B1 | 4/2003 | Yagisawa | |
| 6,583,388 B2 * | 6/2003 | Crafts et al. | 219/209 |
| 6,590,777 B2 | 7/2003 | Morino | |
| 6,590,783 B2 * | 7/2003 | Spratte et al. | 361/800 |
| 6,651,488 B2 | 11/2003 | Larson | |
| 6,655,835 B2 | 12/2003 | Mattoon | |
| 6,671,660 B2 | 12/2003 | Freed | |
| 6,677,166 B2 | 1/2004 | Hunter | |
| 6,691,068 B1 | 2/2004 | Freed | |
| 6,734,027 B2 | 5/2004 | Jonkers | |
| 6,738,722 B2 | 5/2004 | Poolla | |
| 6,741,945 B2 | 5/2004 | Poolla | |
| 6,759,253 B2 | 7/2004 | Usui | |
| 6,789,034 B2 | 9/2004 | Freed | |
| 6,889,568 B2 | 5/2005 | Renken | |
| 6,895,831 B2 | 5/2005 | Hunter | |
| 6,915,589 B2 | 7/2005 | Sun | |
| 6,966,235 B1 | 11/2005 | Paton | |
| 6,971,036 B2 | 11/2005 | Freed | |
| 6,995,691 B2 | 2/2006 | Parsons | |
| 7,005,644 B2 | 2/2006 | Ishikawa | |
| 7,135,852 B2 | 11/2006 | Renken | |
| 7,151,366 B2 | 12/2006 | Renken | |
| 7,331,250 B2 | 2/2008 | Hunter | |
| 7,360,463 B2 | 4/2008 | Renken | |
| 7,361,030 B2 * | 4/2008 | Inoue et al. | 439/76.1 |
| 7,385,199 B2 | 6/2008 | DeWames | |
| 7,417,198 B2 * | 8/2008 | Betz et al. | 174/536 |
| 7,434,485 B2 | 10/2008 | Hunter | |
| 7,555,948 B2 * | 7/2009 | Wiese et al. | 29/592.1 |
| 7,757,574 B2 | 7/2010 | Renken | |
| 7,819,033 B2 | 10/2010 | Renken | |
| 7,855,549 B2 | 12/2010 | Renken | |
| 2001/0002119 A1 | 5/2001 | Winterer | |
| 2001/0012639 A1 | 8/2001 | Akram | |
| 2004/0031340 A1 | 2/2004 | Renken | |
| 2004/0074323 A1 | 4/2004 | Renken | |
| 2006/0174720 A1 | 8/2006 | Renken | |
| 2007/0147468 A1 | 6/2007 | Matsumoto et al. | |
| 2008/0228419 A1 | 9/2008 | Renken | |
| 2009/0056441 A1 | 3/2009 | Sun et al. | |
| 2010/0155098 A1 | 6/2010 | Sun et al. | |
| 2010/0294051 A1 | 11/2010 | Renken et al. | |

FOREIGN PATENT DOCUMENTS

| | | |
|---|---|---|
| EP | 0764977 | 3/1997 |
| EP | 0865922 | 9/1998 |
| EP | 1014437 | 6/2000 |
| GB | 2086807 | 5/1982 |
| JP | 08-092739 A | 4/1996 |
| JP | 2008261971 | 10/1996 |
| KR | 10-2009-0023097 A | 3/2009 |
| WO | 0068986 | 11/2000 |
| WO | 0217030 | 2/2002 |
| WO | 03067183 | 8/2003 |
| WO | 2008042903 | 4/2008 |
| WO | 2008103700 | 8/2008 |

OTHER PUBLICATIONS

Yehiel Gotkis et al. U.S. Appl. No. 60/820,324, filed Jul. 25, 2006.

Baker et al.;"Novel in Situ Monitoring Technique for Reactive Ion Etching Using a Surface Micromachined Sensor," IEEE Transactions on Semiconductor Manufacturing, vol. 11, No. 2, May 1998, pp. 254-264.

U.S. Appl. No. 60/285,613, filed Apr. 19, 2001; Freed et al.;Firmware, Methods, Apparatus, and Computer Program Products for Wafer Sensors.

U.S. Appl. No. 60/285,439, filed Apr. 19, 2001; Freed et al.;"Methods Apparatus, and Computer Program Products for Obtaining Data for Process Operation, Optimization, Monitoring, and Control".

Freed et al.;"Autonomous On-Wafer Sensors for Process Modeling, Diagnosis, and Control," IEEE Transactions on Semiconductor Manufacturing, vol. 14,No. 3, Aug. 2001, pp. 255-264.

Freed; "Wafer-Mounted Sensor Arrays for Plasma Etch Processes", Dissertation, Univ. of CA. Berkeley, Fall 2001.

Rubitherm GmbH, "Rubitherm® RT, Phase Change Material based on n-Paraffins and Waxes," Innovative PCM's and Thermal Technology, Rubitherm Phase Change Material, Version: Jun. 15, 2004, 2 pages.

PTO, "Office Action," corresponding U.S. Appl. No. 10/685,550, filed Sep. 25, 2006, 18 pages.

"Notification of Transmittal of the International Search Report or the Declaration", corresponding PCT application No. PCT/US03/00751, International Searching Authority, European Patent Office, Jun. 8, 2003.

Unsolicited e-mail from Steve Maxwell at steve_maxwell60@yahoo.com to info@phdr-law.com, dated Jan. 3, 2006, 1 page.

Notice of Allowance and Fee(s) due dated Dec. 14, 2009 issued for U.S. Appl. No. 11/302,763.

Ex Parte Quayle Office Action dated Apr. 2, 2010 issued for U.S. Appl. No. 12/106,998.

Notice of Allowance and Fee(s) Due dated Mar. 22, 2010 issued for U.S. Appl. No. 11/302,763.

Office Action dated Jun. 4, 2009 issued for U.S. Appl. No. 11/302,763.

Final Office Action dated Jan. 4, 2009 issued for U.S. Appl. No. 11/302,763.

Office Action dated Jun. 25, 2008 issued for U.S. Appl. No. 11/302,763.

Office Action dated Sep. 25, 2006 issued for U.S. Appl. No. 10/685,550.

Notice of Allowance dated Dec. 17, 2007 for U.S. Appl. No. 10/685,550.

Final Office Action dated Mar. 29, 2007 for U.S. Appl. No. 10/685,550.

Final Office Action dated Mar. 16, 2006 for U.S. Appl. No. 10/685,550.

Office Action dated Jun. 29, 2004 for U.S. Appl. No. 10/685,550.

Final Office Action Dated Jan. 12, 2004 for U.S. Appl. No. 10/056,906.

Office Action dated Jun. 18, 2003 for U.S. Appl. No. 10/056,906.

Office Action dated Oct. 20, 2009 issued for Japanese Patent Application No. 2003-563004.

International Search Report, corresponding to PCT/US03/00751, Aug. 1, 2003, 3 pages.

Office Action dated Aug. 22, 2007 of U.S. Appl. No. 10/685,550.

Notice of Allowance dated Sep. 7, 2004 for U.S. Appl. No. 10/056,906.

U.S. Appl. No. 12/690,882, filed Jan. 20, 2010.

Office Action dated Jan. 25, 2010 issued for Korean Patent Application No. 2004-7011508.

* cited by examiner

HEAT SHIELD MODULE FOR SUBSTRATE-LIKE METROLOGY DEVICE

FIELD OF THE INVENTION

Embodiments of the present invention generally relate to high temperature, substrate-like metrology devices and particularly to heat shield modules that keep components of the devices safe while the device is exposed to high temperatures over an extended period of time.

BACKGROUND OF THE INVENTION

The fabrication of an integrated circuit, display or disc memory generally employs numerous processing steps. Each process step must be carefully monitored in order to provide an operational device. Throughout the imaging process, deposition and growth process, etching and masking process, etc., it is critical, for example, that temperature, gas flow, vacuum pressure, chemical gas or plasma composition and exposure distance be carefully controlled during each step. Careful attention to the various processing conditions involved in each step is a requirement of optimal semiconductor or thin film processes. Any deviation from optimal processing conditions may cause the ensuing integrated circuit or device to perform at a substandard level or, worse yet, fail completely.

Within a processing chamber, processing conditions may vary. The variations in processing conditions such as temperature, gas flow rate and/or gas composition greatly affect the formation and thus the performance of the integrated circuit. Using a substrate-like device to measure the processing conditions that is of the same or similar material as the integrated circuit or other device provides the most accurate measure of the conditions because the thermal conductivity of the substrate is the same as that of the actual circuits to be processed. Specifically, wireless substrate-like devices are preferred over wired substrate-like devices because wired substrate-like devices are cumbersome to use and latency associated with such devices is non-ideal. Gradients and variations exist throughout the chamber for virtually all process conditions. These gradients therefore also exist across the surface of a substrate. In order to precisely control processing conditions at the substrate, it is critical that measurements be taken upon the substrate and that the readings are available to an automated control system or operator so that the optimization of the chamber processing conditions can be readily achieved. Processing conditions include any parameter used to control semiconductor or other device manufacture or any condition a manufacturer would desire to monitor.

In order for such wireless substrate-like metrology devices to function in high temperature environments (e.g., temperatures greater than about 150° C.), certain key components of the device, such as thin batteries and microprocessors, must be able to function when the device is exposed to the high temperature environment. Many device fabrication processes operate at temperatures greater than 150° C. For example, a back AR coating (BARC) process operates at 250° C.; a chemical vapor deposition (CVD) process may operate at a temperature of about 500° C.; and a physical vapor deposition (PVD) process may operate at about 300° C. Unfortunately, batteries and microprocessors suitable for the requirements for such a device typically cannot withstand temperatures above 150° C. While wired substrate-like devices may be configured to withstand temperatures above 150° C., they are not preferred for the reasons stated above.

An additional challenge faced by such wireless substrate-like metrology devices is minimization of the device profile. Such devices should keep a profile of 5 mm or less above the top surface of the substrate in order to fit into various process chambers.

Conventionally, temperature-sensitive wireless metrology device components (e.g., batteries, CPU, etc.) are shielded from high temperatures using insulating modules. U.S. patent application Ser. No. 12/690,882, filed Jan. 20, 2010 discloses one such insulating module. Such an insulating module comprises a component encapsulated on both sides by an insulating layer (e.g., ceramic or other microporous insulating material), the combination being further encapsulated on both sides by a high specific heat enclosure. The insulating module may then be bonded to the substrate, attached to the substrate by way of kinematic supports, or formed within the substrate.

While such insulating modules do achieve the goal of shielding temperature-sensitive wireless metrology device components, they exhibit several undesirable characteristics that make it non-ideal. For one, these insulating modules are extremely complex to manufacture due to the need to ensure a vacuum between the component, insulating layer, and high specific heat enclosure. Additionally, these insulating modules have a high chance of collapsing when exposed to atmospheric pressure due to the presence of low pressure within the module. Further, the use of insulating machinable ceramic and micro porous insulation such as Microsil has the disadvantage of generating contaminating particles that may affect the performance of the processing chamber. Microsil is a specific name for a micro porous insulation material available from Zircar Ceramics, Inc. of Florida, N.Y. Additionally, these materials are also quite difficult to construct and attach, causing added complexity in assembly as well as reliability issues.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Figure 1A:
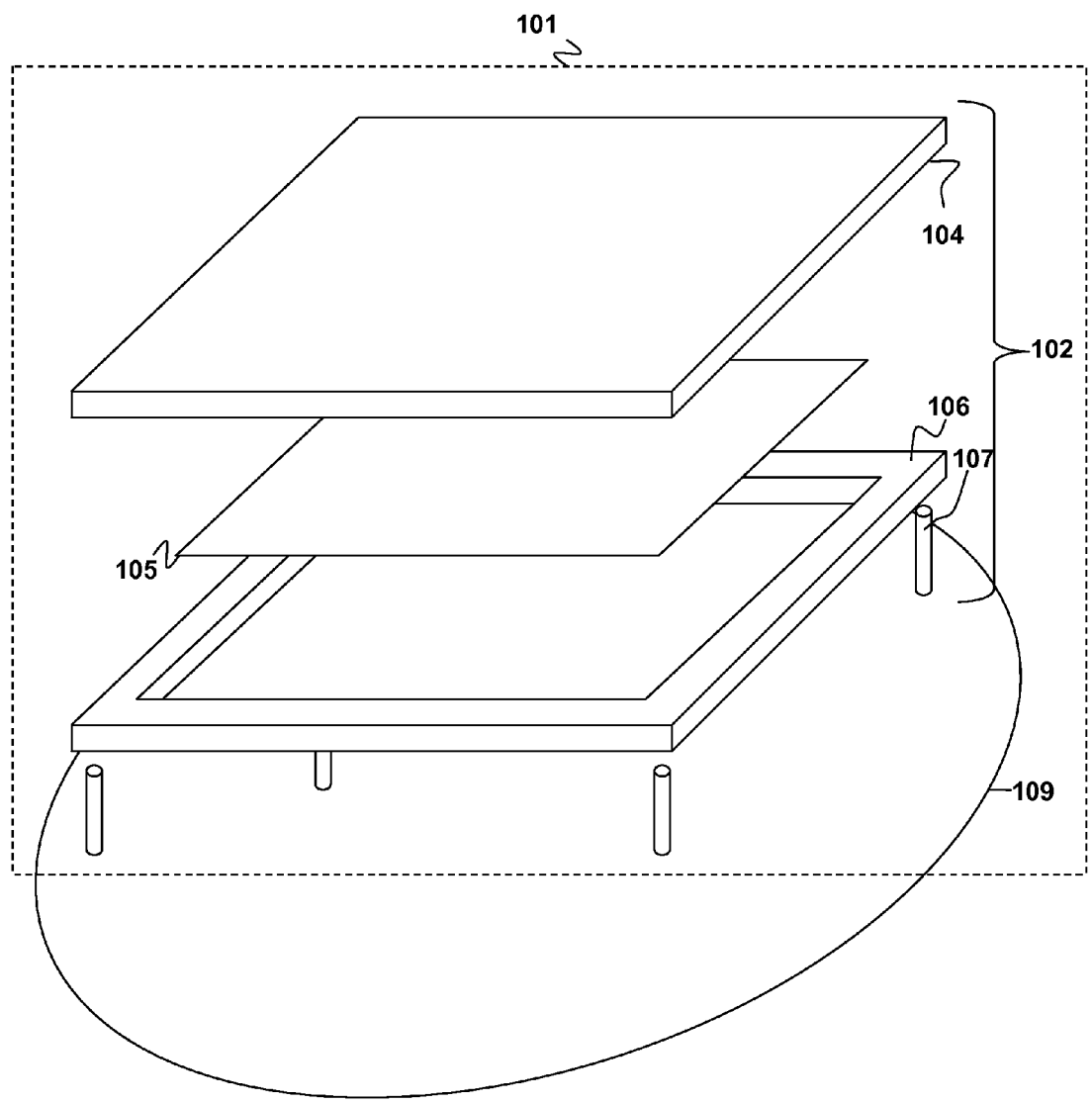
FIG. 1A is an exploded three dimensional diagram of a substrate-like metrology device with a heat shield module for electronic component packages according to an embodiment of the present invention.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention utilize heat shield modules to keep components of a substrate-like metrology device, particularly temperature-sensitive electronic component packages, within a safe operating temperature range while the substrate-like metrology device is exposed to high temperatures over an extended period of time.

In some embodiments, the heat shield module can be used as a part of a component module. Such modules may be incorporated into substrate-like metrology devices used to measure uniformity of the processing conditions from reports of the sensors in various locations of a wafer or substrate and the data is used to correct the conditions of subsequent processing. As defined herein, "processing conditions" refer to various processing parameters used in manufacturing an integrated circuit, display, disc memory, etc. Processing conditions include any parameter used to control semiconductor manufacture or any condition a manufacturer would desire to monitor such as but not limited to temperature, processing chamber pressure, gas flow rate within the chamber, gaseous chemical composition within the chamber, ion current density, ion current energy, light energy density, and vibration and acceleration of the wafer.

Such substrate-like metrology devices are typically composed of two principal pieces: the substrate and a set of metrology device components. The substrate is used to mount sensors for measuring the processing conditions of semiconductor manufacturing equipment, glass substrate processing equipment, magnetic memory disc processing equipment, etc. Specifically, the sensors are used to measure the conditions that a wafer or substrate undergoes during processing. Such sensors may measure, e.g., temperature, electric current, voltage, particle flux, heat flux, or other conditions during processing. The sensors can be arranged on different areas on the surface or within the substrate in order to measure the processing conditions across the substrate. By measuring in different areas of the substrate, the non-uniformity across the substrate can be calculated, and additionally, the condition at a particular location of the substrate can be correlated to the resultant characteristics of the substrate.

The set of metrology device components are connected to the substrate and configured to facilitate the measurement and analysis of process conditions by providing support to the substrate-like metrology device by way of batteries, memory, central processing unit (CPU), etc. These substrate-like metrology devices are subjected to processing conditions that often involve harsh conditions that negatively affect the functionality, accuracy, and reliability of the associated wireless metrology device components. Furthermore, numerous other processing steps and conditions make it advantageous to shield the wireless metrology device components. Separating the wireless substrate-like metrology device into two components (i.e., substrate and wireless metrology device components) allows the device to shield the components from various detrimental processing conditions while still allowing the substrate to accurately measure process conditions.

The remainder of the specification makes reference to a specific subset of metrology device components when describing embodiments of the heat shield module, namely an electronics component package. By way of example, and not by way of limitation, the electronics component package may comprise a battery, memory, transceiver, CPU, or any other electronic components configured to facilitate measurement and analysis of process conditions. While the remaining discussion in the specification is directed towards electronics component packages (i.e., subset of wireless metrology device components), it is important to note that the heat shielding modules described below specification may also be configured to shield various alternative temperature sensitive wireless metrology device components from heat depending on the application.

FIG. 1A is an exploded three dimensional diagram of a substrate-like metrology device 100 according to an embodiment of the present invention. The metrology device 100 includes a component module 101 that can be mounted to a substrate. The component module 101 includes a heat shield module 102. The heat shield module 102 includes a top portion 104, a bottom portion 106, and a set of one or more legs 107. The heat shield module 102 may be attached to a substrate 109 by the legs 107. The substrate 109 may include sensors configured to measure process conditions to form a substrate-like metrology device 100 as discussed above. The top portion 104 and the bottom portion 106 are attached to each other to form an enclosure 103 that includes an opening sized to receive a temperature-sensitive component 105 with no intervening insulating material between the component 105 and the inside walls of the enclosure 103. By way of example, the component 105 may include an electronic component package, such as a battery, memory, transceiver, CPU, etc. It is important to note that various different temperature sensitive metrology device components in addition to the electronics component package may be shielded by the heat shield module 102 depending on the application. It is noted that within the context of embodiments of the invention, the enclosure 103 may be larger than the component 105. The component 105 may be very thin. By way of example, the component 105 may have a total thickness of about 1.0 mm or less, perhaps as thin as 375 microns or less, or 150 microns or less.

The size of the enclosure 103 could be slightly larger than the size of electronic component package 105. In such a case, there may be an intervening empty space between the electronic component package 105 and the inside walls of the enclosure 103. Alternatively, there could be adhesive material present to secure electronic component package 105 to top portion 104 or to bottom portion 106. However, the empty space or the adhesive material is not regarded as an "insulating material", as that term is used herein. It is further noted that although the component package 105 is an element of the component module 101, the component 105 is not a required element of the heat shield module 102.

The heat shield portions 104, 106 may be attached to each other, e.g., using a suitable adhesive (e.g., Fire Temp glue) or other bonding technique to form the enclosure 103 that receives the electronic component package. This enclosure provides a heat shield to an electronics component package enclosed therein. While the heat shield module 102 depicted in FIG. 1A illustrates a recessed opening formed within the top surface of the bottom portion 104 for receiving the component 105, any number of other configurations may be used to allow reception of the component 105. Examples of such alternative configurations will be discussed below.

The top portion 104 and bottom portion 106 are made of high heat capacity materials. As used herein, the term "heat capacity" refers to the volumetric heat capacity of the material; it is the amount of heat required to change an object's temperature by a given amount. An object with a higher heat capacity requires a greater amount of heat to raise its temperature the same amount as an object of identical volume with a lower heat capacity.

By way of example, and not by way of limitation, the top portion 104 and the bottom portion 106 may be made of stainless steel. Stainless steel has a very high heat capacity, and as such requires a large amount of heat or an extended period of heat exposure for significant increases in temperature. Alternatively, the top portion 104 and bottom portion 106 may be composed of sapphire, Kovar, Invar, or any other material that exhibits a heat capacity similar to that of stainless steel. Kovar is a trademark of Carpenter Technology Corporation of Reading, Pa. Kovar refers to a nickel-cobalt ferrous alloy designed to be compatible with the thermal expansion characteristics of borosilicate glass. The composition of Kovar is nominally about 29% nickel, 17% cobalt, less than 0.1% carbon, 0.2% silicon, 0.3% manganese with the balance being iron. Invar, also known generically as FeNi36 (64FeNi in the US), is a nickel steel alloy notable for its uniquely low coefficient of thermal expansion (CTE or α). Invar is a trademark of Imphy Alloys Joint Stock Company France of Hauts-De-Seine, France.

The enclosure 103 formed by the top and bottom portions 104, 106 is further mounted on a set of one or more legs 107 (e.g., four legs) to form the heat shield module 102. The legs 107 allow the electronics components package 105 to be positioned away from the substrate 109. Several advantages arise from this configuration and are discussed in detail below. Generally, the cross-sectional dimensions of the legs are such that the legs are relatively long and thin in order to reduce the heat transfer through the legs 107.

An air gap or vacuum (i.e., conditions present in the process chamber) formed between a top surface of the substrate 109 and a bottom surface of the bottom portion 106 provides an additional layer of insulation. Thus, heat retained by the substrate 109 is not directly transferred to the high heat capacity portions 104, 106 due to the insulating layer formed by the air gap/vacuum. To form an effective insulating layer, the distance d between the top surface of the substrate and the bottom surface of the bottom high heat capacity component 106 should be at least 0.25 millimeters (mm). By taking advantage of the insulating layer formed by the air gap/vacuum, an additional insulating material within the high heat capacity portions 104, 106 of the heat shielding module 102 may be eliminated, leading to advantages over the prior art to be discussed below.

Furthermore, the legs 107 may be configured to provide a very limited conductive heat transfer path from the substrate 109 to the heat shield module portions 104, 106. By way of example, and not by way of limitation, the diameter/width of the legs 107 may be decreased in order to limit heat transfer. Legs 107 may range in size from 0.05 mm in diameter or width (if not round) to more than 1.0 mm and are preferably of a minimal diameter or width of about 0.5 mm. The heat transfer efficiency between the substrate 109 and the high heat capacity portions 104, 106 may also be limited making the legs 107 from a high-strength low thermal conductivity and/or high heat capacity material. By way of example, and not by way of limitation, these legs 107 may be composed of stainless steel, quartz, or any other materials that are strong enough to hold the heat shield module portions 104, 106 above the substrate 109 and exhibit low heat transfer characteristics.

Thus, the legs 107 provide an additional insulating layer (i.e., air, vacuum) for the temperature-sensitive component 105 and limit heat transfer between the substrate 109 and the portions 104, 106 enclosing the component 105.

The dimensions of the heat shield module 102 may be constrained by the dimensions of the processing chamber in which the metrology device 100 is used. Consequently, the height h of the heat shield module 102 may be configured to meet the specifications of the processing chamber. The height h of the heat shield module 102 refers to the distance between the top surface of the substrate 109 and the top surface of the top portion 104. For example, many substrate processing chambers receive substrates though a load lock or slit valve having a finite sized opening. By way of example, and not by way of limitation, the height h of the heat shield module 102 may be limited to between about 2 millimeters and about 10 millimeters for typical processing chambers. However, this height h may be varied depending on the particular application for which the substrate-like metrology device is being used.

The high heat capacity portions 104, 106 may additionally be polished to provide a low emissivity surface for further heat shielding. Alternatively, the surfaces of the heat shield module portions 104, 106 may be coated with a low emissivity thin film material. As used herein, a material having a surface with an emissivity between 0.0 and 0.2 can be considered "low emissivity". Radiation from the process chamber or the substrate 109 contributes to the temperature increase of the portions 104, 106. By polishing the surface of the high heat capacity portions 104, 106, a significant portion of the radiating heat may be reflected from the portions 104, 106. This will reduce heat transfer to portions 104 and 106 from substrate 109 and process chamber walls, by radiation, which in turn would result in slower heating of the component 105.

The heat shielding module 102 thus provides several layers of protection to the component 105 being shielded (i.e., high heat capacity enclosure shielding, air gap/vacuum insulation, low heat transfer from legs, and reflection of radiation), thus retaining the heat shielding characteristics of the prior art. In addition, the invented heat shielding module 102 also provides several advantages over the prior art, described below.

By enclosing an electronics component package within a heat shield made from high heat capacity portions, temperature-sensitive electronics can be shielded from processing conditions that exhibit high temperature. Since the temperature of high heat capacity portions 104, 106 rise at slow rate (due to high heat capacity), the temperature of electronics component package 105 enclosed by those high heat capacity portions 104, 106 also rises at a slow rate. This is because the temperature change of the component 105 closely tracks that of its shielding high heat capacity portions 104, 106 due to their proximity.

Prior art heat shielding modules incorporated a ceramic or microporous insulating layer as part of their design. However, it is found that insulting ceramics or other types of insulating materials such as micro porous insulation produce a significant amount of micro-particles that present a severe contamination hazard in processing chambers. By eliminating the need for an insulating layer, and simply using high heat capacity portions 104, 106 to shield the electronics component package 105, the invented heat shielding module 102 removes any particle contamination that was present in the prior art.

Another advantage of the invented heat shield module 102 is the ease of assembly. Because the invented heat shield module 102 is composed of only two portions 104, 106 and a set of one or more legs 107, it is much simpler to manufacture and produce than the multi-component, multi-layer heat shield modules described above with respect to the prior art. Moreover, the simplicity of design ensures greater reliability of the heat shield module 102 because there are fewer components that may potentially fail.

The use of stainless steel as the high heat capacity material for forming high heat capacity portions 104, 106 has the added benefit of an even more simplified manufacturing process because stainless steel high heat capacity components may be readily machined with the legs easily mounted thereon.

Thus, the heat shielding module 102 retains the heat shielding characteristics present in the prior art, while eliminating the complexity of manufacturing and potential for particle contamination also present in the prior art by eliminating the ceramic insert that occupied space between the electronic component package and the inside walls of the enclosure.

Figure 1B:
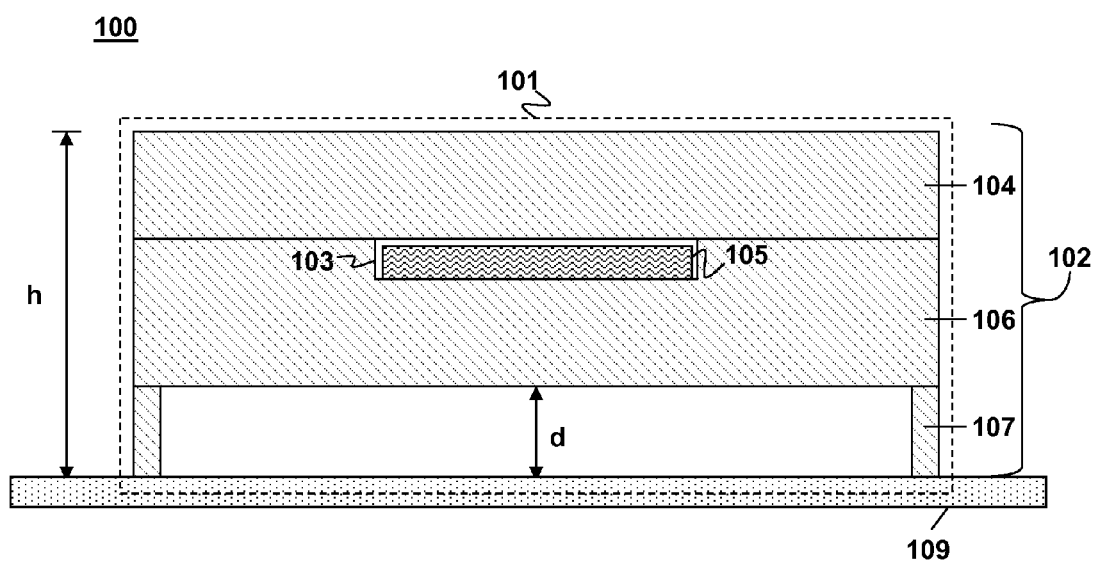
FIG. 1B is a cross-sectional view of the substrate-like metrology device with a heat shield module for electronic component packages in FIG. 1A.

FIG. 1B illustrates a cross-sectional view of the wireless substrate-like metrology device 100 with a heat shield module for electronic component packages of FIG. 1A. Here, the heat shield module 102 is composed of a top high heat capacity portion 104, a bottom high heat capacity portion 106, and a set of one or more legs 107 to be mounted on a substrate 109. Again, it is noted that the component 105 is not a required component of the heat shield 102. In this embodiment, the top portion 104 and bottom portion 106 are of the same length. The bottom portion 104 has an opening recessed within its top surface that is sized to receive a component 105 (e.g., an electronic component package) with no intervening insulating material between the package 105 and the heat shield module portions 104, 106. Again, it is noted that various different temperature sensitive components of substrate-like metrology devices in addition to the electronics component package may be shielded by the heat shield module 102 depending on the application. The legs 107 are mounted to a bottom surface of the bottom portion 106, and configured to form an insulating air gap/vacuum between the bottom surface of the bottom portion 106 and the substrate 109.

While the heat shield module 102 depicted in FIG. 1B illustrates a recessed opening formed within the top surface of the bottom portion 106 for receiving the component 105, any number of other configurations may be used to allow reception of the component 105. Examples of such alternative configurations will be discussed below.

Figure 2A:
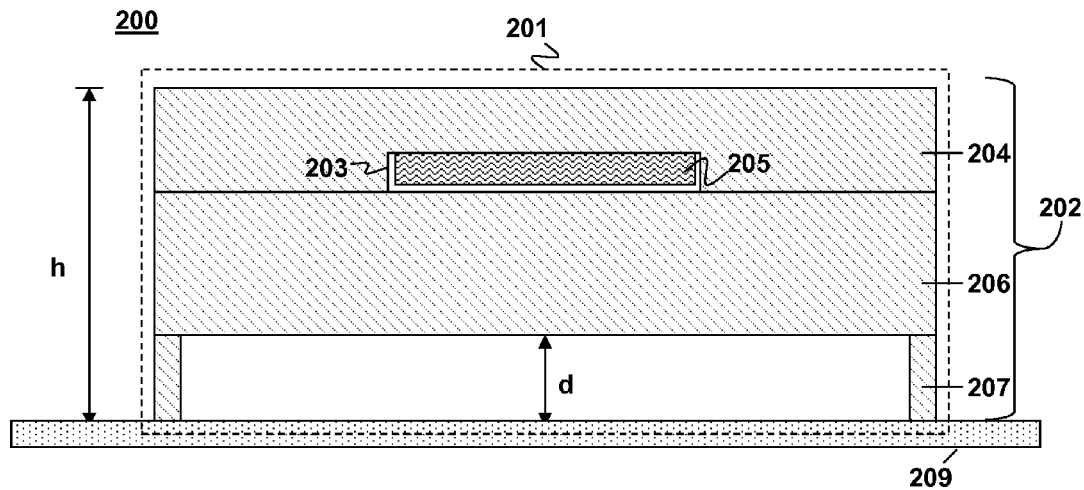
FIG. 2A is a cross-sectional view of a substrate-like metrology device with a heat shield module for electronic component packages according to an alternative embodiment of the present invention.
Figure 2B:
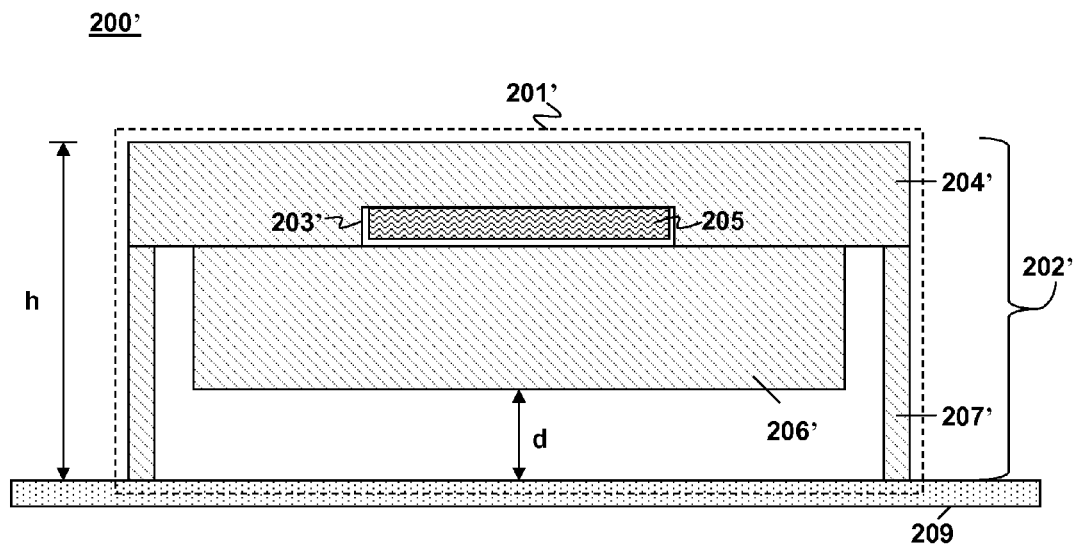
FIG. 2B is a cross-sectional view of a substrate-like metrology device with a heat shield module for electronic component packages according to an alternative embodiment of the present invention.
Figure 2C:
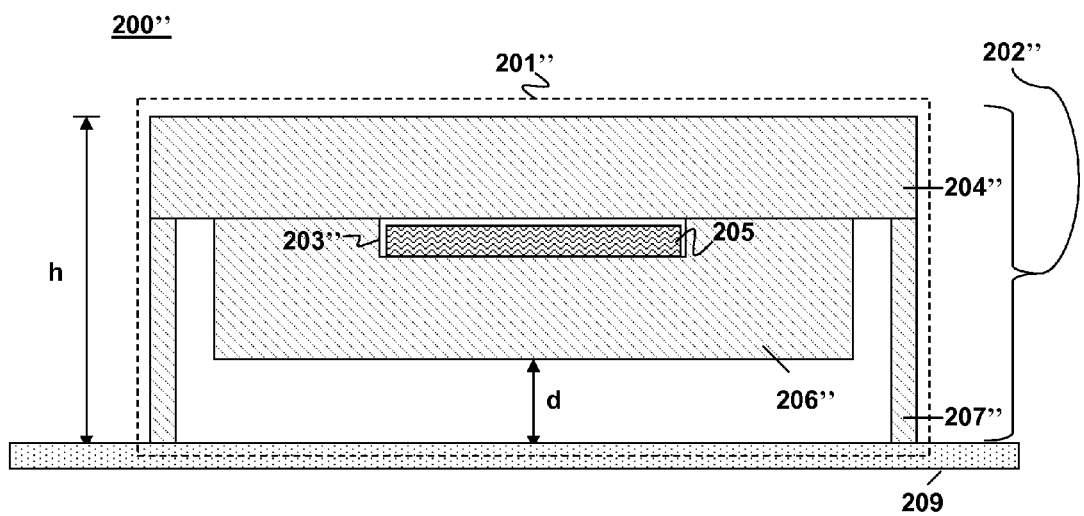
FIG. 2C is a cross-sectional view of a substrate-like metrology device with a heat shield module for electronic component packages according to an alternative embodiment of the present invention.

FIGS. 2A-2C illustrate cross-sectional views of wireless substrate-like metrology devices 200 with heat shield modules for electronic component packages in accordance with alternative embodiments of the present invention.

FIG. 2A illustrates a cross-sectional view of a wireless substrate-like metrology device 200 with an electronic component module 201 having a heat shield module 202 for an electronic component package in accordance with an alternative embodiment of the present invention. Here, the heat shield module 202 is composed of a top high heat capacity portion 204, a bottom high heat capacity portion 206, and one or more legs 207 to be mounted on a substrate 209. The heat shield module portions 204, 206 form an enclosure 203 sized to receive a component 205, such as an electronic component package. Again, it is noted that various different temperature sensitive wireless metrology device components in addition to an electronics component package may be shielded by the heat shield module 202 depending on the application. The component 205 is not a component of the heat shield module 202'. The heat shield module 202' may be made of the same materials and otherwise configured as the heat shield module 102 described above with respect to FIGS. 1A and B. Furthermore, the heat shield module 202' may be configured to accommodate height constraints and distance constraints between the bottom surface of the bottom portion 206 and the top surface of the substrate 209, as described above. It is noted that in alternative embodiments, the legs 207' may be attached to the sides of the bottom portion 206 or top portion 204.

In this embodiment, the top portion 204 and bottom portion 206 are of approximately the same two-dimensional size and shape, though they may have different thicknesses. The top portion 204 rather than the bottom portion 206 has an opening recessed within its bottom surface that is sized to receive the electronic component package 205 with no intervening insulating material between the component 205 and the top and bottom portions 204, 206. The legs 207 may again be mounted to a bottom surface of the bottom portion 206, and configured to allow an insulating air gap/vacuum between the bottom surface of the bottom portion 206 and the substrate 209 when the heat shield module is mounted to the substrate.

FIG. 2B illustrates a cross-sectional view of a wireless substrate-like metrology device 200' with an electronic component module 201' having a heat shield module 202' for a substrate-like metrology device in accordance with an alternative embodiment of the present invention. Here, the heat shield module 202' includes a top high heat capacity portion 204', a bottom high heat capacity portion 206', and a set of one or more legs 207' to facilitate mounting the heat shield module 202' to a substrate 209. When attached together, the heat shield module portions 204', 206' form an enclosure 203' sized to receive a component 205. Again, it is noted that various different temperature sensitive wireless metrology device components in addition to an electronics component package may be shielded by the heat shield module 202' depending on the application. The component 205 is not a component of the heat shield module 202'. The heat shield module 202' may be configured in many respects similarly to the heat shield module 102 described above with respect to FIGS. 1A and 1B. Furthermore, the heat shield module 202' may be configured to accommodate height constraints and the distance constraints between the bottom surface of the bottom portion 206' and the top surface of the substrate 209. In this embodiment, the top portion 204 and bottom portion 206' have different two-dimensional shapes and/or sizes. Specifically, the bottom portion 206' has a characteristic dimension smaller than the corresponding dimension of the top portion 204'. The top portion 204' has an opening recessed within its bottom surface that is sized to receive the component 205 with no intervening insulating material between the package 205 and the top and bottom portions 204', 206', when assembled to form the electronic component module 201'. The legs 207' are mounted to a bottom surface of the top portion 204' rather than the bottom surface of the bottom portion 206'. The legs 207' space the heat shield module apart from the surface of the substrate 209 to form an insulating air gap/vacuum between the bottom surface of the bottom portion 206' and the substrate 209.

FIG. 2C illustrates a cross-sectional view of a substrate-like metrology device 200" in accordance with another alternative embodiment of the present invention. The metrology device 200" includes an electronic component module 201" that has a heat shield module 202" for a component 205. Again, it is noted that various different temperature sensitive wireless metrology device components in addition to the electronics component packages may be shielded by the heat shield module 202" depending on the application. The heat shield module 202" includes a top high heat capacity portion 204", a bottom high heat capacity portion 206", and a set of one or more legs 207". In this embodiment, the top portion 204" and bottom portion 206" are of different sizes and possibly of different shapes. The bottom portion 206" has a characteristic dimension that is smaller than the corresponding dimension of the top portion 204". The bottom portion 206" rather than the top portion 204" has an opening recessed within its top surface that is sized to receive the component 205 with no intervening insulating material between the component 205 and the heat shield module portions 204", 206". The legs 207" are mounted to a bottom surface of the top portion 204" rather than the bottom surface of the bottom portion 206". The legs 207" may be configured to provide an insulating air gap/vacuum between the bottom surface of the bottom high heat capacity portion 206" and the substrate 209 when the heat shield module 202" is mounted to the substrate 209. It is noted that in alternative embodiments, the legs 207" may be attached to the sides of the top portion 204".

It is noted once again that the component 205 is not an element of the heat shield module 202". As with previous examples, the heat shield module 202" may be composed of the same materials and may be otherwise configured similarly to the heat shield module 102 described above with respect to FIG. 1A. Furthermore, the electronics component module 201" may be configured to accommodate height constraints of the heat shield module 202" and the distance constraints between the bottom surface of the bottom portion 206" and the top surface of the substrate 209, as discussed above.

While FIGS. 1A-B, 2A, 2B, and 2C illustrate some specific examples of heat shield module, electronic component module, and substrate-like metrology device configurations, the claimed invention is not limited to these embodiments. Any combination of shapes and sizes may be used to form the top high heat capacity portion and the bottom high heat capacity portion, so long as they conform to the claims set forth below. For example, the recessed opening that is sized to receive an electronic component package may be formed in the top high heat capacity portion, the bottom high heat capacity portion, or a combination of both. Additionally, the legs may be mounted to either the bottom high heat capacity portion or the top high heat capacity portion, or a combination of both, so long as an insulating air gap/vacuum layer is formed between the substrate and the bottom surface of the bottom high heat capacity portion.

Figure 3:
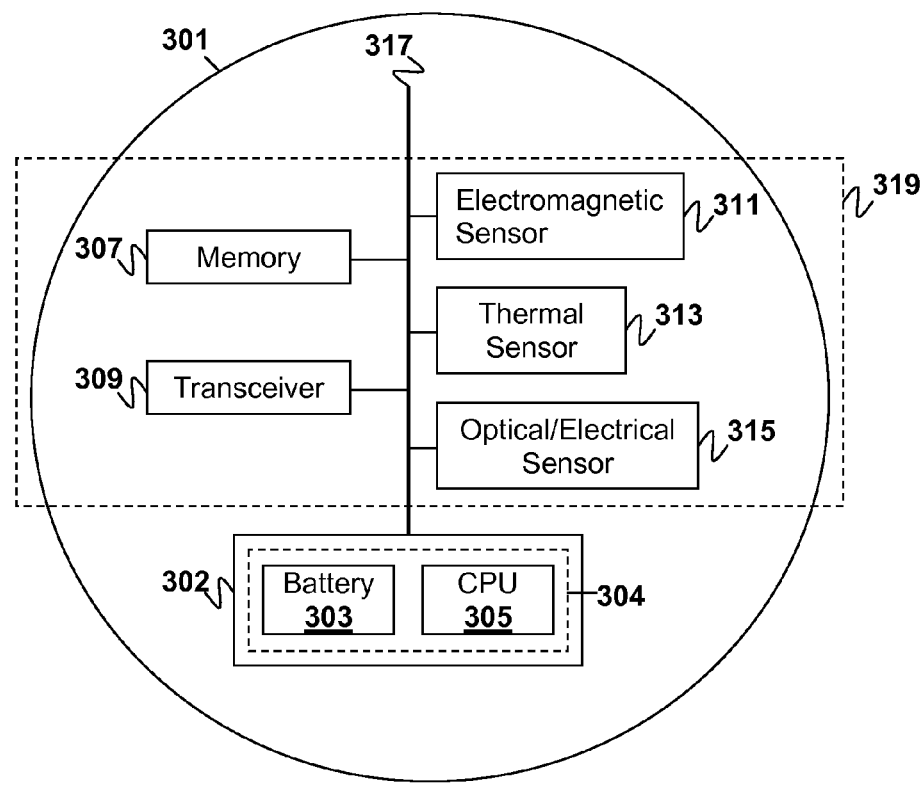
FIG. 3 is a top view schematic diagram of a substrate-like metrology device with a heat shield module mounted on top of the substrate.

FIG. 3 is a top-view schematic diagram of a wireless substrate-like metrology device 300 with a heat shield module 302 of the type depicted in FIGS. 1A-1B and FIGS. 2A-2C mounted on a top surface of a substrate 301. The substrate 301 may be the same size and shape as a standard substrate processed by a substrate processing system. The substrate 301 may also be made of the same material as a standard substrate processed by the system. For example, if the metrology device is used to monitor process conditions in a semiconductor wafer processing system that processes silicon wafers, the substrate 301 may be made of silicon. Examples of standard sized silicon substrates include, but are not limited to 150-mm, 200-mm and 300-mm diameter silicon wafers.

A temperature-sensitive electronic component package 304 of the type depicted in FIGS. 1A to 1B and FIGS. 2A to 2C may be mounted within an opening of the heat shield module 302 sized to receive an electronic component package 304 with no intervening insulating material between the electronic component package and the high heat capacity components, as discussed above. Again, it is important to note that the heat shield module is not limited to shielding electronic component packages, but instead may be configured to shield any temperature sensitive wireless metrology device component depending on the application. By way of example, and not by way of limitation, such an electronic component package 304 may include a battery 303 and CPU 305. There may be only a single battery package or alternatively more than one battery installed, depending on the application and resulting power needs. The electronic component package 304 may be electrically connected to a bus 317.

The wireless substrate-like metrology device 300 may include measurement electronics 319 that are powered by the batteries 303 and that are configured to exchange electronic signals with the CPU 305 through the bus 317. By way of example, and not by way of limitation, the measurement electronics 319 may include a memory 307, a transceiver 309, and one or more process condition sensors, e.g., an electromagnetic sensor 311, a thermal sensor 313, and an optical or electrical sensor 315. In some embodiments, certain elements of the measurement electronics 305 (e.g., the memory 307, transceiver 309, thermal sensor 313, or optical sensor 315) may be included within the electronic component package 105 of the types described herein.

The CPU 305 may be configured to execute instructions stored in the main memory 307 in order for the wireless substrate-like metrology device 300 to properly measure and record process parameters when the device 300 is placed within a substrate processing tool. The main memory 307 may be in the form of an integrated circuit, e.g., RAM, DRAM, ROM, and the like. The transceiver 309 may be configured to communicate data and/or electrical power to or from the device 300.

Figure 4:
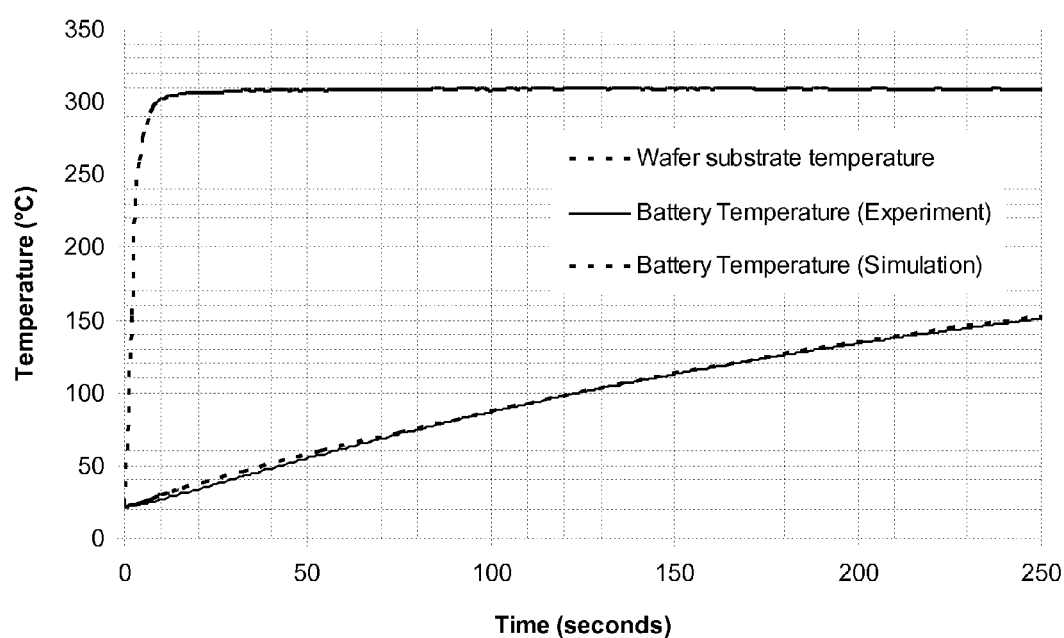
FIG. 4 is a graph illustrating temperature dependent behavior of a heat shielding module configured in accordance with an embodiment of the present invention.

Test results obtained with stainless steel high heat capacity portions 104, 106 are shown in FIG. 4. In this test a substrate was placed on a hot plate that was heated to 310° C. The substrate temperature rose to above 300° C. within 10 seconds. A battery that was enclosed by stainless steel high heat capacity portions 104, 106 mounted to the substrate by legs took 243 seconds to reach 150° C. A battery, in a previous design of heat shield which had insulating material between the electronic component and enclosure, took 120 seconds to reach to 150° C. when the wafer substrate was placed on a hot plate of temperature 300° C.

Although the present invention has been described in considerable detail with reference to certain preferred versions thereof, other versions are possible. Therefore, the spirit and scope of the appended claims should not be limited to the description of the preferred versions contained herein. Instead, the scope of the invention should be determined with reference to the appended claims, along with their full scope of equivalents. All the features disclosed in this specification (including any accompanying claims, abstract, and drawings) may be replaced by alternative features serving the same, equivalent, or similar purpose, unless expressly stated otherwise. Thus, unless expressly stated otherwise, each feature disclosed is one example of a generic series of equivalent or similar features.

While the above is a complete description of the preferred embodiment of the present invention, it is possible to use various alternatives, modifications and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC §112, ¶6. In particular, the use of "step of" in the claims herein is not intended to invoke the provisions of 35 USC §112, ¶6.

The reader's attention is directed to all papers and documents which are filed concurrently with this specification and which are open to public inspection with this specification, and the contents of all such papers and documents incorporated herein by reference.

What is claimed is:

1. A heat shield module, comprising:
   a) a top portion made of a high heat capacity material;
   b) a bottom portion made of a high heat capacity material attached to the top portion, wherein an enclosure formed by the top portion and the bottom portion includes an opening sized to receive a component with no intervening insulating material between the component and the top and bottom portions, wherein the opening is slightly larger than the component;
   c) one or more legs mounted to either the top portion or the bottom portion, the legs being configured to attach the heat shield module to a substrate and to form a gap between a bottom surface of the bottom portion and a top surface of the substrate.

2. The heat shield module of claim 1, wherein the top portion and/or the bottom portion is made of stainless steel.

3. The heat shield module of claim 1, wherein an entire surface of the top portion and/or an entire surface of the bottom portion is polished to form a low emissivity surface.

4. The heat shield module of claim 1, wherein an entire surface of the top portion and/or an entire surface of the bottom portion is coated with a low emissivity material.

5. The heat shield module of claim 1, wherein the top portion and/or the bottom portion is composed of sapphire.

6. The heat shield module of claim 1, wherein the top portion and/or the bottom portion is composed of a nickel-cobalt ferrous alloy.

7. The heat shield module of claim 1, wherein the top portion and/or the bottom portion is composed of a nickel-steel alloy known generically as FeNi36.

8. The heat shield module of claim 1, wherein the one or more legs is composed of stainless steel.

9. The heat shield module of claim 1, wherein the one or more legs is composed of quartz.

10. The heat shield module of claim 1, wherein the one or more legs are configured such that the gap formed between the top surface of the substrate and the bottom surface of the bottom portion is at least 0.25 millimeters.

11. The heat shield module of claim 1, wherein top portion, bottom portion, and the one or more legs are configured such that a height of the heat shield module is between 2 millimeters and 10 millimeters above the top surface of the substrate when the heat shield module is mounted to the substrate.

12. The heat shield module of claim 1, wherein the enclosure is sized to receive a component having a thickness of 1 millimeter or less.

13. A component module, comprising:
    a heat shield module including a top portion made of a high heat capacity material and a bottom portion made of a high heat capacity material with an enclosure formed by the top and bottom portions;
    a component disposed in the enclosure, wherein the enclosure includes an opening sized to receive the component with no intervening insulating material between the component and the top and bottom portions, wherein the component is mounted to a surface of the enclosure with no intervening insulating material between the component and the surface of the enclosure; and
    one or more legs attached to the heat shield module, the legs being configured to attach the enclosure to a substrate and to form a gap between a bottom surface of the bottom portion and a top surface of the substrate.

14. The component module of claim 13, wherein the component includes one or more batteries.

15. The component module of claim 13, wherein the component includes a central processing unit (CPU).

16. The component module of claim 13, wherein the component has a total thickness in the order of 1 millimeter or less.

17. The component module of claim 13, wherein the top portion and/or the bottom portion is made of stainless steel.

18. The component module of claim 13, wherein an entire surface of the top portion and/or an entire surface of the bottom portion is polished to form a low emissivity surface.

19. The component module of claim 13, wherein an entire surface of the top portion and/or an entire surface of the bottom portion is coated with a low emissivity material.

20. The component module of claim 13, wherein the top portion and/or the bottom portion is composed of sapphire.

21. The component module of claim 13, wherein the top portion and/or the bottom portion is composed of a nickel-cobalt ferrous alloy.

22. The component module of claim 13, wherein the top portion and/or the bottom portion is composed of a nickel-steel alloy known generically as FeNi36.

23. The component module of claim 13, wherein the one or more legs is composed of stainless steel.

24. The component module of claim 13, wherein the one or more legs is composed of quartz.

25. The component module of claim 13, wherein the one or more legs are configured such that the gap formed between the top surface of the substrate and the bottom surface of the bottom portion is at least 0.25 millimeters.

26. The component module of claim 13, wherein the top portion, the bottom portion, and the one or more legs are configured such that a height of the heat shield module is between 2 millimeters and 10 millimeters above the top surface of the substrate when the heat shield module is mounted to the substrate.

27. The component module of claim 13, wherein the opening is slightly larger than the component.

28. The component module of claim 13, wherein the component is secured to the surface of the enclosure by an adhesive.

29. A substrate-like metrology device, comprising:
    a substrate; and
    a heat shield module including a top portion made of a high heat capacity material and a bottom portion made of a high heat capacity material with an enclosure formed by the top and bottom portions, wherein the enclosure includes an opening sized to receive a component with no intervening insulating material between the component and the top and bottom portions, wherein the opening is slightly larger than the component; and
    one or more legs attached to the heat shield module, the legs being configured to attach the enclosure to the substrate and to form a gap between the bottom surface of the bottom portion and a top surface of the substrate.

30. The device of claim 29, further comprising a component disposed in the enclosure, wherein the component is an electronic component package.

31. The device of claim 30, wherein the electronic component package is secured in the enclosure by an adhesive.

32. The device of claim 30, wherein the electronic component package is mounted to a surface of the enclosure with no intervening insulating material between the electronic component package and the surface of the enclosure.

\* \* \* \* \*